United States Patent
Liu

(10) Patent No.: US 9,504,152 B2
(45) Date of Patent: Nov. 22, 2016

(54) PRINTED CIRCUIT BOARD FOR SEMICONDUCTOR PACKAGE

(71) Applicant: Samsung Electronics Co., Ltd., Suwon-si, Gyeonggi-do (KR)

(72) Inventor: Hai Liu, Suzhou (CN)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/748,970

(22) Filed: Jun. 24, 2015

(65) Prior Publication Data

US 2016/0005683 A1    Jan. 7, 2016

(30) Foreign Application Priority Data

Jul. 2, 2014    (CN) .................. 2014 1 0312409
Mar. 2, 2015   (KR) .................. 10-2015-0029106

(51) Int. Cl.
| | |
|---|---|
| H05K 1/11 | (2006.01) |
| H01L 23/498 | (2006.01) |
| H05K 3/46 | (2006.01) |
| H01L 23/538 | (2006.01) |
| H01L 23/00 | (2006.01) |
| H01L 25/065 | (2006.01) |
| H01L 25/10 | (2006.01) |

(52) U.S. Cl.
CPC ......... *H05K 1/111* (2013.01); *H01L 23/49816* (2013.01); *H01L 23/49838* (2013.01); *H01L 23/5386* (2013.01); *H05K 3/46* (2013.01); *H01L 23/49822* (2013.01); *H01L 23/49827* (2013.01); *H01L 23/49894* (2013.01); *H01L 23/5383* (2013.01); *H01L 23/5384* (2013.01); *H01L 24/13* (2013.01); *H01L 24/16* (2013.01); *H01L 24/32* (2013.01); *H01L 24/73* (2013.01); *H01L 25/0657* (2013.01); *H01L 25/105* (2013.01); *H01L 2224/131* (2013.01); *H01L 2224/13144* (2013.01); *H01L 2224/13147* (2013.01); *H01L 2224/16145* (2013.01); *H01L 2224/16227* (2013.01); *H01L 2224/32145* (2013.01); *H01L 2224/32225* (2013.01); *H01L 2224/73204* (2013.01); *H01L 2224/814* (2013.01); *H01L 2224/81815* (2013.01); *H01L 2225/06513* (2013.01); *H01L 2225/06517* (2013.01); *H01L 2225/06541* (2013.01); *H01L 2225/06565* (2013.01); *H01L 2225/1023* (2013.01); *H01L2225/1058* (2013.01); *H01L 2924/15311* (2013.01); *H01L 2924/15323* (2013.01); *H01L 2924/15331* (2013.01); *H01L 2924/181* (2013.01)

(58) Field of Classification Search
CPC ....... H05K 1/111; H05K 1/112; H05K 1/113
See application file for complete search history.

(56) References Cited

U.S. PATENT DOCUMENTS

| | | | | |
|---|---|---|---|---|
| 3,436,615 | A * | 4/1969 | Finlayson | 257/765 |
| 7,371,974 | B2 * | 5/2008 | Toyoda et al. | 174/262 |
| 8,436,467 | B2 | 5/2013 | Morifuji et al. | |
| 2007/0109758 | A1 | 5/2007 | Han et al. | |
| 2009/0133902 | A1 | 5/2009 | Kim et al. | |

FOREIGN PATENT DOCUMENTS

| | | |
|---|---|---|
| CN | 101681859 A | 3/2010 |
| CN | 202425199 U | 9/2012 |
| CN | 103227160 A | 7/2013 |

OTHER PUBLICATIONS

Chinese Office Action dated Jul. 4, 2016, issued in corresponding Chineseese Patent Application No. 201410312409.7.

* cited by examiner

*Primary Examiner* — Jeremy C Norris
(74) *Attorney, Agent, or Firm* — Harness, Dickey & Pierce, P.L.C.

(57) ABSTRACT

A printed circuit board for a semiconductor package including a printed circuit board body, a plurality of ball lands on one surface of the printed circuit board body, a first plating layer on a portion of each of the ball lands, and a second plating layer on another portion of each of the ball lands may be provided. An upper surface of the first plating layer may be coplanar with an upper surface of the second plating layer.

18 Claims, 16 Drawing Sheets

PRINTED CIRCUIT BOARD FOR SEMICONDUCTOR PACKAGE

CROSS-REFERENCE TO RELATED APPLICATIONS

This application claims the benefit of the State Intellectual Property Office (SIPO) of the People's Republic of China No. 201410312409.7, filed on Jul. 2, 2014, in SIPO of the People's Republic of China and Korean Patent Application No. 10-2015-0029106, filed on Mar. 2, 2015, in the Korean Intellectual Property Office, the disclosures of each of which are incorporated herein in their entirety by reference.

BACKGROUND

The inventive concepts relate to printed circuit boards, and more particularly, to printed circuit boards for a semiconductor package, capable of improving both thermal cycle reliability and drop reliability.

Recently, reduction in size of portable electronic devices, for example, mobile phones, has accelerated. Therefore, development has been conducted to reduce the size and thickness of semiconductor packages used in portable electronic devices in order to realize thin, small, and high performance semiconductor packages. Flip-chip bonding, instead of wire bonding, has been widely used to connect a semiconductor chip to a printed circuit board to reduce an overall thickness of a semiconductor package.

SUMMARY

Some of the inventive concepts provides a printed circuit board for semiconductor packages, capable of both improving thermal cycle reliability and drop reliability.

In one example embodiment, a printed circuit board for a semiconductor package includes a printed circuit board body, a plurality of ball lands on one surface of the printed circuit board body, a first plating layer on a portion of each of the ball lands, and a second plating layer on another portion of each of the ball lands. An upper surface of the first plating layer may be coplanar with an upper surface of the second plating layer.

The first plating layer or the second plating layer may have a single-layered structure or a multi-layered structure.

At least one of the first plating layer and the second plating layer may be made of a plurality of materials.

The first plating layer may include at least one selected from the group consisting of Ni/Au, Ni/Pd/Au, Ni/Ag, Ni/Pd/Ag, Ni/Sn, Ni/Cu, and Ni/Pd.

The second plating layer may include at least one selected from the group consisting of organic solderability preservative (OSP), Ag, Au, Pd, and Sn.

When the printed circuit board is viewed from above, the first plating layer and the second plating layer may be alternately arranged in a checkerboard pattern.

When the printed circuit board is viewed from above, the first plating layer and the second plating layer may have a circular shape.

A surface where the first plating layer and the second plating layer contact the ball lands may form a concave-convex shape when viewed laterally.

The ball lands, the first plating layer, and the second plating layer may be electrically connected to one another.

The first plating layer and the second plating layer may cover all upper surfaces of the ball lands.

In one example embodiment, a printed circuit board for a semiconductor package includes a printed circuit board body including internal metal wirings; a plurality of ball lands on one surface of the printed circuit board body and electrically connected to the internal metal wirings, a first plating layer on a portion of each of the ball lands, and a second plating layer formed on another portion of each of the ball lands. The first plating layer and the second plating layer may form a concave-convex shape when viewed laterally.

An upper surface of the first plating layer may be higher than an upper surface of the second plating layer with respect to the printed circuit board body.

The ball land may have a concave-convex shape having a convex portion and a concave portion, and the first plating layer may cover the convex portion of the ball land and the second plating layer may fill the concave portion of the ball land.

The first plating layer may be formed by stacking different conductive metals.

The first plating layer may be configured to improve thermal cycle reliability and the second plating layer may be configured to improve drop reliability.

In one example embodiment, a printed circuit board for a semiconductor package includes a printed circuit board, a ball land on one surface of the printed circuit board, a plurality of first plating layers and a plurality of second plating layers on the ball land, the first plating layers and the second plating layers interleaving each other.

The ball land may include a plurality of grooves defined therein and each of the grooves may be at least partially filled with at least a portion of a corresponding one of the first plating layers.

Upper surfaces of the first plating layers may be substantially coplanar with upper surfaces of the second plating layers.

Each of the first plating layers may include an upper layer and a lower layer, the lower layer may fill a corresponding one of the grooves to provide a convex portion protruding from a top surface of the ball land, and the upper layer may cover top and side surfaces of the convex portion.

The second plating layers may cover top and side surfaces of a plurality of convex portions of the ball land that are defined by the grooves.

BRIEF DESCRIPTION OF THE DRAWINGS

Some example embodiments of the inventive concepts will be more clearly understood from the following detailed description taken in conjunction with the accompanying drawings in which.

DETAILED DESCRIPTION

Figure 1:
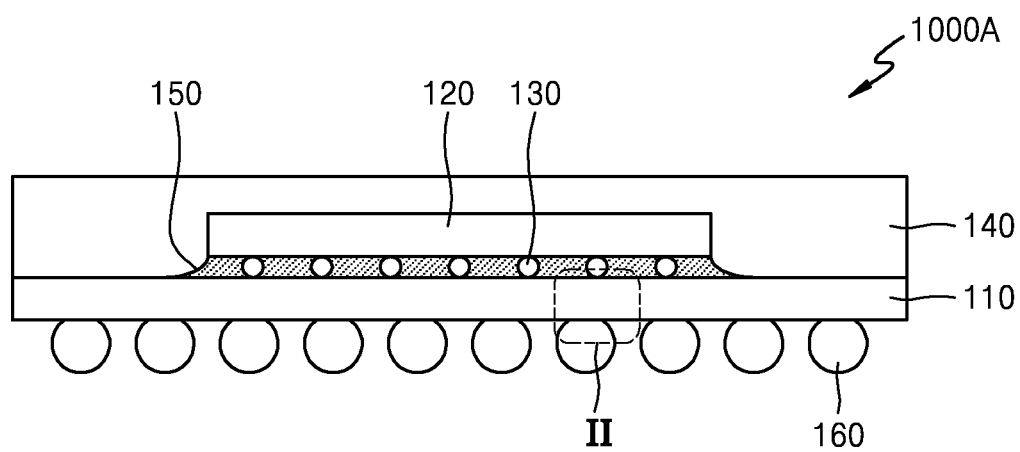
FIG. 1 is a cross-sectional view of a semiconductor package including a printed circuit board for a semiconductor package, according to an example embodiment of the inventive concepts.

Hereinafter, some example embodiments of the inventive concepts will be described with reference to the accompanying drawings. The inventive concepts may, however, be embodied in many different forms and should not be construed as being limited to the example embodiments set forth herein; rather, these example embodiments are provided so that this disclosure will be thorough and complete, and will fully convey the inventive concepts to those of ordinary skill in the art. It should be understood, however, that there is no intent to limit the inventive concepts to the particular forms disclosed, but on the contrary, the inventive concepts is to cover all modifications, equivalents, and alternatives falling within the spirit and scope of the inventive concepts. In the drawings, the dimensions of structures are exaggerated for clarity of the inventive concepts.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms "first", "second", "third", etc. may be used herein to describe various elements, these elements should not be limited by these terms. These terms are only used to distinguish one element from another. For example, a first element may be referred to as a second element, and similarly, a second element may be referred to as a first element without departing from the scope of protection of the inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the inventive concepts. As used herein, the singular forms "a", "an", and "the" are intended to include the plural forms as well, unless the context clearly indicates otherwise. It will be understood that terms such as "comprise", "include", and "have", when used herein, specify the presence of stated features, integers, steps, operations, elements, components, or combinations thereof, but do not preclude the presence or addition of one or more other features, integers, steps, operations, elements, components, or combinations thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of example embodiments. It should also be noted that in some alternative implementations, the functions/acts noted may occur out of the order noted in the figures. For example, two figures shown in succession may in fact be executed substantially concurrently or may sometimes be executed in the reverse order, depending upon functionalities/acts involved.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless otherwise defined herein, the terms used in the example embodiments may be construed as meaning commonly known to those skilled in the art.

Unless mentioned particularly here, a vertical direction and a horizontal direction refer to a vertical direction and a horizontal direction with respect to a main surface of a printed circuit board for a semiconductor package. Also, unless mentioned particularly here, an upper surface of a component stacked on a printed circuit board of semiconductor packages refers to a surface opposite to the printed circuit board of semiconductor packages, and a lower surface thereof refers to a surface facing the printed circuit board of semiconductor packages. Hereinafter, example embodiments of the inventive concepts will be described in detail with reference to the accompanying drawings.

FIG. 1 s a cross-sectional view of a semiconductor package 1000A including a printed circuit board 110 for a semiconductor package, according to an example embodiment of the inventive concepts.

FIG. 1 illustrates a semiconductor package 1000A to which the printed circuit board 110 for a semiconductor package according to an example embodiment of the inventive concepts is applied. The semiconductor package 1000A has a structure in which a semiconductor chip 120 is directly mounted on the printed circuit board 110 through internal connection terminals 130.

The semiconductor package 1000A may further include an underfill 150 that fills a gap between the semiconductor chip 120 and the printed circuit board 110. Further, the semiconductor package 1000A may include a molding member 140 that seals the semiconductor chip 120 mounted on the printed circuit board 110. The semiconductor package 1000A may include external connection terminals that are disposed under the printed circuit board 110 for expanding a function of the semiconductor chip 120 to the outside.

According to an example embodiment of the inventive concepts, the internal connection terminals 130 may be a conductive material used to bond the semiconductor chip 120 to the printed circuit board 110 using tape-automated bonding (TAB) or flip-chip bonding. According to another example embodiment of the inventive concepts, the internal connection terminals 130 may be a conductive material that directly connects, for example, a ball grid array (BGA), a chip scale package (CSP), etc., to the printed circuit board 110. The internal connection terminal 130 may be, for example, a solder bump, or a solder ball.

When the internal connection terminal 130 is a solder bump, the internal connection terminal 130 maintains a ball shape due to the effect of surface tension after a reflow process. If the internal connection terminal 130 is a gold bump, the internal connection terminal 130 may be formed to have a shape of a rectangular cylinder. According to an example embodiment of the inventive concepts, a metal material, such as solder, gold, or copper may be used as a material of the internal connection terminal 130.

As illustrated in FIG. 1, the internal connection terminal 130 may be smaller than an external connection terminal 160.

Figure 2:
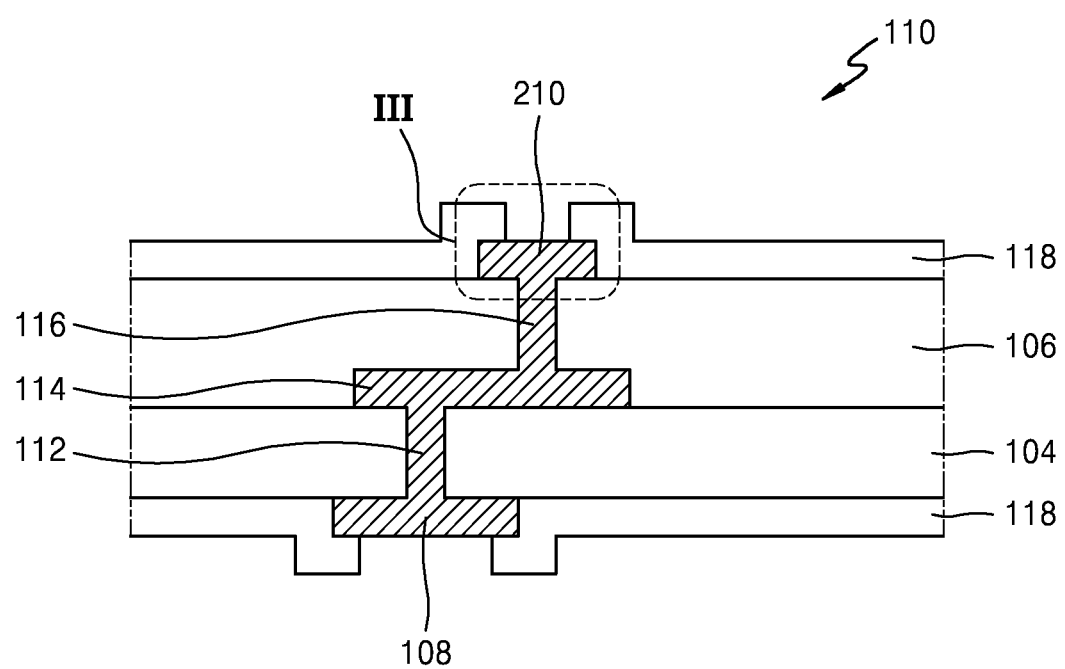
FIG. 2 is an enlarged cross-sectional view of a portion "II" of FIG. 1 showing an internal vertical structure of the printed circuit board.

FIG. 2 is an enlarged cross-sectional view of a portion "II" of FIG. 1 showing an internal vertical structure of the printed circuit board 110.

For example, FIG. 2 illustrates a cross-sectional view of the printed circuit board 110 in which a ball land 210, on which the internal connection terminal 130 (see FIG. 1) is disposed, overlaps an upper via 116. The ball land 210, an intermediate metal layer 114, and a lower metal layer 108 are sequentially stacked in two insulating layers, for example, upper and lower insulating layers 104 and 106. The ball land 210, the intermediate metal layer 114, and the lower metal layer 108 are electrically connected to one another through the upper via 116 and a lower via 112. Further, the ball land 210 and the lower metal layer 108 may be covered by a solder resist 118 while exposing connection portions of the ball land 210 and the lower metal layer 108. The exposed region of the lower metal layer 108 may be a region to which the external connection terminal 160 (see FIG. 1), for example, a solder ball, is attached. The exposed region of the ball land 210 may be a region to which the internal connection terminal 130 (see FIG. 1) of a semiconductor chip is connected.

As described above, the internal connection terminal 130 (see FIG. 1) may be smaller than the external connection terminal 160 (see FIG. 1). Therefore, the exposed region of the ball land 210 may be smaller than the exposed region of the lower metal layer 108.

Although the printed circuit board 110 for a semiconductor package having three metal layers (e.g., the ball land 210, intermediate metal layer 114, and the lower metal layer 108), is illustrated in FIG. 2, the printed circuit board 110 for a semiconductor package may have a more complicated structure having more than three metal layer.

Figure 3:
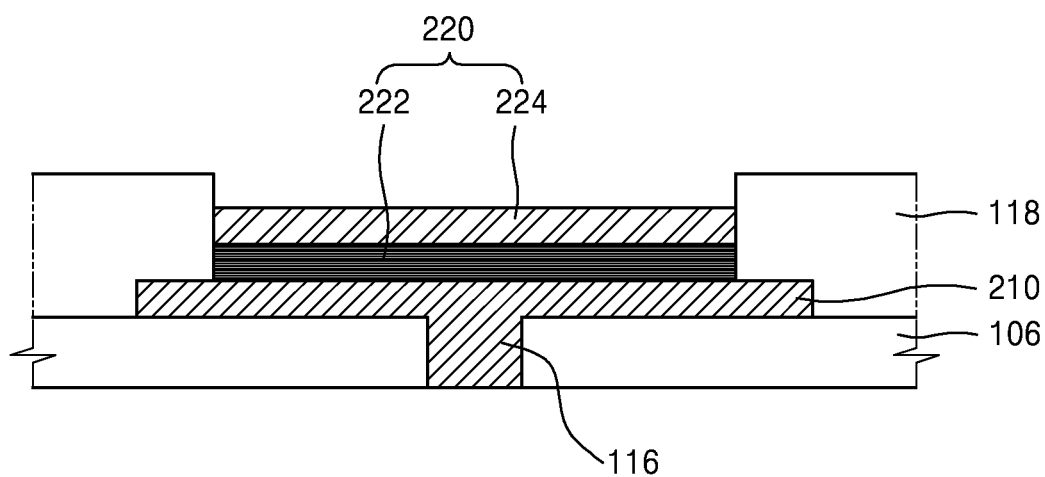
FIG. 3 is a cross-sectional view of a ball land portion "III" of FIG. 2, which shows a printed circuit board for a semiconductor package.

FIG. 3 is a cross-sectional view of a ball land portion "III" of FIG. 2, which shows a printed circuit board for a semiconductor package.

FIG. 3 illustrates an enlarged view of a first plating layer 220 formed on the ball land portion (portion "III") of FIG. 2. The ball land 210 may overlap the upper via 116 as described above. The ball land 210 may be made of copper (Cu) in order to improve conductivity with the internal connection terminal 130 (see FIG. 1). In order to prevent or mitigate oxidation of copper (Cu), the first plating layer 220, which is resistant to oxidation, may be formed on the ball land 210. The first plating layer 220 may be formed by using a plating method (e.g., electroplating, electroless plating, etc.). The first plating layer 220 may include a single layer or a plurality of layers. For example, when the first plating layer 220 includes a lower layer 222 and an upper layer 224, the lower layer 222 may be made of nickel and the upper layer 224 may be made of gold. In this case, the upper layer 224 may be connected to an internal connection terminal 130 (see FIG. 1), for example, a solder bump, to improve the thermal cycle reliability of a solder connection portion.

Figure 4:
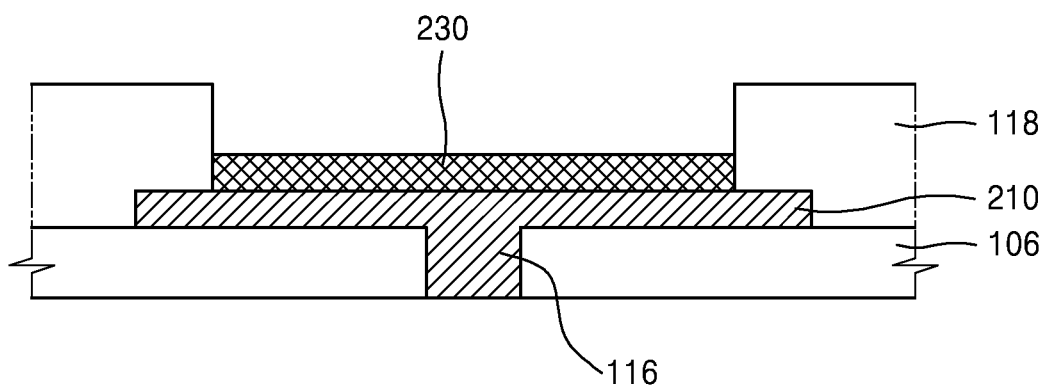
FIG. 4 is a cross-sectional view of a ball land portion "III" of a another printed circuit board for a semiconductor package.

FIG. 4 is a cross-sectional view of a ball land portion "III" of another printed circuit board 110 for a semiconductor package.

FIG. 4 illustrates an enlarged view of a second plating layer 230 formed on the ball land portion (portion "III") of FIG. 2. As described above, the ball land 210 may overlap the upper via 116. The ball land 210 may be made of copper (Cu) in order to improve conductivity with the internal connection terminal 130 (see FIG. 1). In order to prevent or mitigate oxidation of copper (Cu), the second plating layer 230, which is resistant to oxidation may be formed on the ball land 210. The second plating layer 230 may be formed by using a plating method, for example, electroplating or electroless plating. The second plating layer 230 may include a single layer or a plurality of layers. For example, the second plating layer 230 may be made of gold (Au), silver (Ag), palladium (Pd) or tin (Sn). In this case, the second plating layer 230 may be connected to an internal connection terminal 130 (see FIG. 1), for example, a solder bump, to improve the drop reliability of a solder connection portion.

Figure 5:
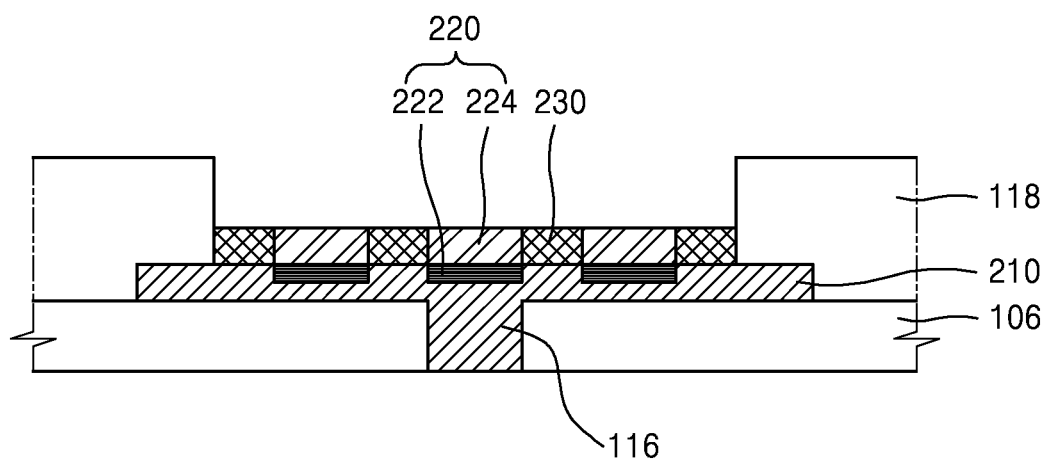
FIG. 5 is a cross-sectional view of a ball land portion of a printed circuit board for a semiconductor package, according to an example embodiment of the inventive concepts.

FIG. 5 is a cross-sectional view of a ball land portion of a printed circuit board 110 for a semiconductor package, according to an example embodiment of the inventive concepts.

FIG. 5 illustrates an enlarged view of a first plating layer 220 and a second plating layer 230 formed on the ball land portion (portion "III") of FIG. 2. As described above, the ball land 210 may overlap the upper via 116. The ball land 210 may be made of copper (Cu) in order to improve conductivity with the internal connection terminal 130 (see FIG. 1). In order to prevent or mitigate oxidation of copper (Cu), the first plating layer 220 and the second plating layer 230, which are resistant to oxidation, may be formed on the ball land 210. The first plating layer 220 may be formed by using a plating method, for example, electroplating or electroless plating. The first plating layer 220 may include a single layer or a plurality of layers. For example, when the first plating layer 220 includes a lower layer 222 and an upper layer 224, the lower layer 222 may be made of nickel (Ni) and the upper layer 224 may be made of gold (Au). In this case, the upper layer 224 may be connected to an internal connection terminal 130 (see FIG. 1), for example, a solder bump, to improve the thermal cycle reliability of a solder connection portion. The lower layer 222 may mitigate or prevent the solder from diffusing into a surface of the ball land 210. The second plating layer 230 may be formed by using a plating method, for example, electroplating or electroless plating. The second plating layer 230 may include a single layer or a plurality of layers. For example, the second plating layer 230 may be made of gold (Au), silver (Ag), palladium (Pd), or tin (Sn). In this case, the second plating layer 230 may be connected to an internal connection terminal 130 (see FIG. 1), for example, a solder bump, to improve the drop reliability of a solder connection portion.

As described above, the first plating layer 220 may include a single layer or a plurality of layers. For example, the first plating layer 220 may include at least one selected from the group consisting of Ni/Au, Ni/Pd/Au, Ni/Ag, Ni/Pd/Ag, Ni/Sn, Ni/Cu, and Ni/Pd. Although the first plating layer 220 is illustrated as including two layers, the inventive concepts are not limited thereto.

Similarly, the second plating layer 230 may include a single layer or a plurality of layers. For example, the second plating layer 230 may include at least one selected from the group consisting of organic solderability preservative (OSP), Ag, Au, Pd, and Sn. Although the second plating layer 230 is illustrated as including a single layer, the inventive concepts are not limited thereto.

In the case of a printed circuit board, when only the first plating layer 220 is formed on the ball land 210, thermal cycle reliability may be improved, but drop reliability may not be improved. On the other hand, when only the second plating layer 230 is formed on the ball land 210, drop reliability may be improved, but thermal cycle reliability may not be improved. When an electronic component is made to exhibit both improved drop reliability and improved thermal cycle reliability, product reliability and an expected lifetime may be improved.

That is, the printed circuit board according to an example embodiment of the inventive concepts may include both the first plating layer 220 and the second plating layer 230, which are connected to an internal connection terminal 130 (see FIG. 1), for example, a solder bump, thereby improving both the thermal cycle reliability and drop reliability of a solder connection portion, as compared to a case in which only one of the first plating layer 220 and the second plating layer 230 is formed on the ball land 210 in a printed circuit board.

An upper surface of the first plating layer 220 of the printed circuit board 110 for a semiconductor package according to an example embodiment of the inventive concepts may be identical to a level of the upper surface of the second plating layer 230. That is, the upper surface of the first plating layer 220 may be coplanar with the upper surface of the second plating layer 230. When the internal connection terminal 130 (see FIG. 1) is connected to the ball land 210, the connection area between the first plating layer 220 and the second plating layer 230 is constant, thereby providing a structure suitable to improve the thermal cycle reliability and drop reliability of a solder connection portion.

A groove may be formed in a portion of the ball land 210 and a lower layer 222 of the first plating layer 220 may be formed to fill the groove. Since the first plating layer 220 and the second plating layer 230 are formed by a plating method, the above-described structure may be provided in order to match a level of the upper surface of the first plating layer 220 with a level of the upper surface of the second plating layer 230. However, the inventive concepts are not limited thereto. In this regard, additional example embodiments will be described below.

Figure 6:
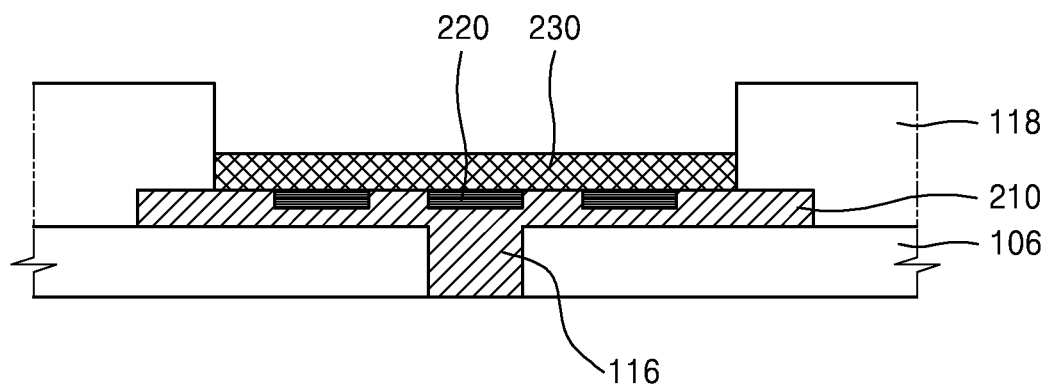
FIG. 6 is a cross-sectional view of a ball land portion of a printed circuit board for a semiconductor package, according to an example embodiment of the inventive concepts.

FIG. 6 is a cross-sectional view of a ball land portion of a printed circuit board for a semiconductor package, according to an example embodiment of the inventive concepts.

The ball land portion of the printed circuit board according to FIG. 6 has a structural difference from the ball land portion of the printed circuit board illustrated in FIG. 5, in which the first plating layer 220 and the second plating layer 230 are formed on the ball land 210. A groove may be formed in a portion of the ball land 210, both a lower layer 222 and an upper layer 224 of the first plating layer 220 may be formed in the groove of the ball land 210. The second plating layer 230 may be formed on the upper surface of the ball land 210 and the upper surface of the first plating layer 220. According to the inventive concepts, a level of the upper surface of the first plating layer 220 may be different from a level of the upper surface of the second plating layer 230. That is, when the ball land 210 portion of the printed circuit board is viewed from above, only the second plating layer 230 is exposed to the outside.

According to another example embodiment, the second plating layer 230 may be formed in the groove of the ball land 210, and the first plating layer 220 may be formed to cover the upper surface of the ball land 210 and the upper surface of the second plating layer 230. That is, when the ball land 210 portion of the printed circuit board is viewed from above, only the first plating layer 220 is exposed to the outside.

Because content which is not described with reference to FIG. 6 is the same as or similar to the contents described with reference to FIG. 5, a description thereof will be omitted.

Figure 7:
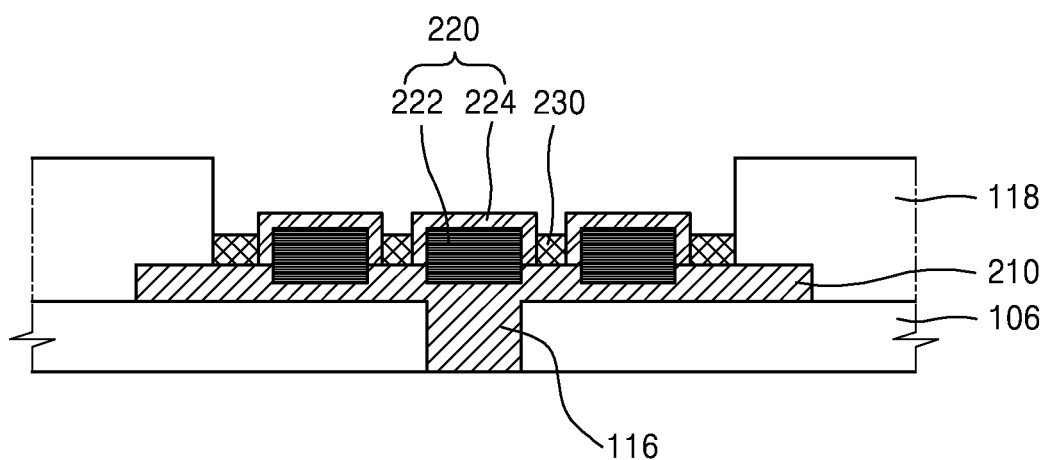
FIG. 7 is a cross-sectional view of a ball land portion of a printed circuit board for a semiconductor package, according to an example embodiment of the inventive concepts.

FIG. 7 is a cross-sectional view of a ball land portion of a printed circuit board 110 for a semiconductor package, according to an example embodiment of the inventive concepts.

The ball land portion of the printed circuit board according to FIG. 7 has a structural difference from the ball land portion of the printed circuit board illustrated in FIG. 5, in which the first plating layer 220 and the second plating layer 230 are formed on the ball land 210. A groove may be formed in a portion of the ball land 210, and a lower layer 222 of the first plating layer 220 may be formed in the groove of the ball land 210. A level of the upper surface of the lower layer 222 may be higher than a level of the upper surface of the ball land 210. An upper layer 224 of the first plating layer 220 may be formed to cover the upper surface and sides of the lower layer 222 of the first plating layer 220. The second plating layer 230 may be formed to cover all regions in which the upper surface of the ball land 210 is exposed and is not covered by the first plating layer 220. According to the inventive concepts, a level of the upper surface of the first plating layer 220 may be different from a level of the upper surface of the second plating layer 230. That is, when the ball land 210 portion of the printed circuit board is viewed from side, the first plating layer 220 and the second plating layer 230 may be formed to have a concave-convex shape. When the first plating layer 220 and the second plating layer 230 form a concave-convex shape, a contact area for connection with internal connection terminals 130 (see FIG. 1) is enlarged, thereby improving a bonding strength between the ball land 210 and the internal connection terminals 130.

According to another example embodiment, the second plating layer 230 may be formed in the groove of the ball land 210 and the first plating layer 220 may be formed in regions in which the upper surface of the ball land 210 are exposed and is not covered by the second plating layer 230.

Other descriptions with reference to FIG. 7 are omitted because they are the same as or similar to the descriptions provided above with reference to FIG. 5.

Figure 8:
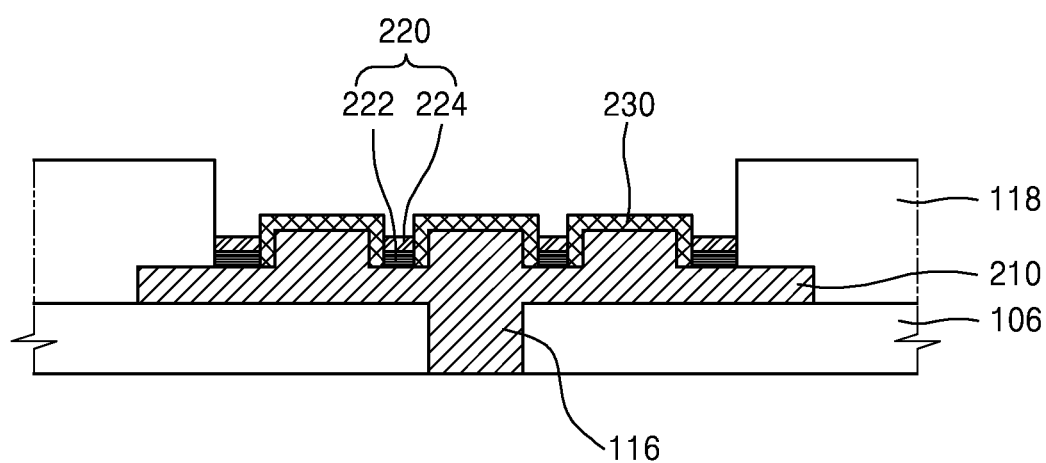
FIG. 8 is a cross-sectional view of a ball land portion of a printed circuit board for a semiconductor package, according to an example embodiment of the inventive concepts.

FIG. 8 is a cross-sectional view of a ball land portion of a printed circuit board 110 for a semiconductor package, according to an example embodiment of the inventive concepts.

The ball land portion of the printed circuit board according to FIG. 8 has a structural difference from The ball land portion of the printed circuit board for a semiconductor package illustrated in FIG. 5, in which the first plating layer 220 and the second plating layer 230 are formed on the ball land 210. A groove may be formed in a portion of the ball land 210, and a convex portion may be formed around the groove. The second plating layer 230 may be formed to cover the upper surface and sides of the convex portion. A lower layer 222 and an upper layer 224 of the first plating layer 220 both may be formed in the groove in which the upper surface of the ball land 210 is exposed and is not covered by the second plating layer 230. According to the inventive concepts, a level of the upper surface of the first plating layer 220 may be different from a level of the upper surface of the second plating layer 230. That is, when the ball land 210 portion of the printed circuit board is viewed from side, the first plating layer 220 and the second plating layer 230 may form a concave-convex shape. When the first plating layer 220 and the second plating layer 230 form a concave-convex shape, a contact area for connection with internal connection terminals 130 (see FIG. 1) may be enlarged, thereby improving a bonding strength between the ball land 210 and the internal connection terminals 130.

According to another example embodiment, the first plating layer 220 may be formed in the convex portion of the ball land 210 and the second plating layer 230 may be formed in the groove in which the upper surface of the ball land 210 are exposed and is not covered by the first plating layer 220.

Other descriptions with reference to FIG. 8 are omitted because they are the same as or similar to the descriptions provided above with reference to FIG. 5.

FIGS. 9A to 9D are top views illustrating arrangements of a first plating layer 220 and a second plating layer 230 that cover a ball land of a printed circuit board for a semiconductor package, according to some example embodiments of the inventive concepts.

Referring to FIGS. 9A to 9D, there are top views of the first plating layer 220 and the second plating layer 230 formed on the ball land 210. When a portion of the ball land 210, on which the first plating layer 220 and the second plating layer 230 are formed as described with reference to FIGS. 5, 7, and 8, is viewed from above, shapes or patterns as illustrated in FIGS. 9A to 9D may be provided.

Figure 9A:
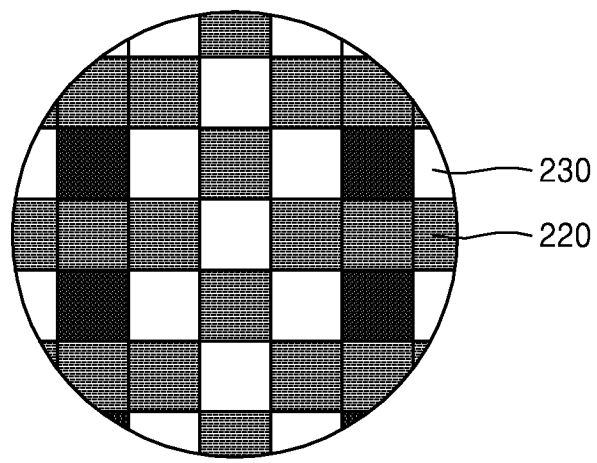
FIGS. 9A to 9D are top views illustrating arrangements of a first plating layer and a second plating layer that cover a ball land of a printed circuit board for a semiconductor package, according to some example embodiments of the inventive concepts.
Figure 9B:
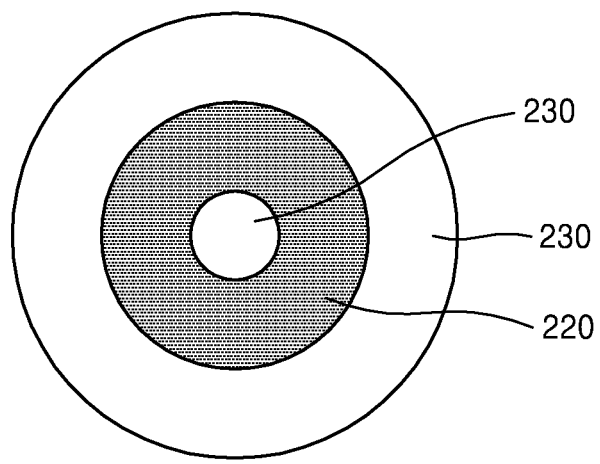
Figure 9C:
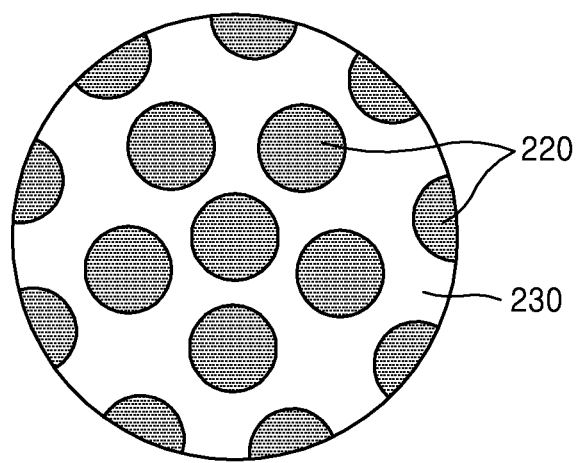
Figure 9D:
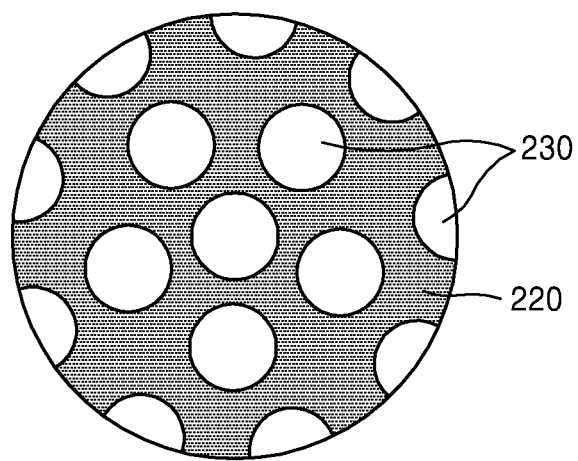

Referring to FIG. 9A, the first plating layer 220 and the second plating layer 230 may be alternately formed in a checkerboard pattern. Referring to FIG. 9B, the first plating layer 220 and the second plating layer 230 may be formed as different-sized rings. Referring to FIG. 9C, the first plating layer 220 may be a spotted small circles and the second plating layer 230 may be formed in the remaining region in which the spotted small circles are not formed. On the other hand, referring to FIG. 9D, the second plating layer 230 may be a spotted small circles and the first plating layer 220 may be formed in the remaining region in which the spotted small circles are not formed.

The inventive concepts are not limited to the above shapes. Any variations in which the first plating layer 220 and the second plating layer 230 exist on the upper surface of the ball land 210 may be possible according to example embodiments of the inventive concepts.

That is, the exposed regions of the first plating layer 220 and the second plating layer 230 may be maintained to be approximately a ratio of 1:1, regardless of a shape in which the first plating layer 220 and the second plating layer 230 are formed. In this case, the ball land portion of a printed circuit board may have a shape capable of improving both thermal cycle reliability and drop reliability of a solder connection portion may be realized.

FIGS. 10A to 10H are cross-sectional views of a method of manufacturing a printed circuit board 110 for a semiconductor package, according to an example embodiment of the inventive concepts.

Figure 10A:
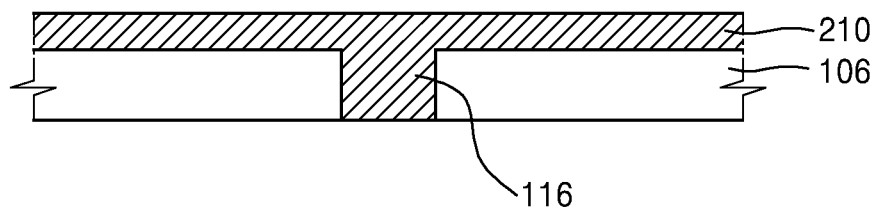
FIGS. 10A to 10H are cross-sectional views illustrating a method of manufacturing a printed circuit board for a semiconductor package, according to an example embodiment of the inventive concepts.

Referring to FIG. 10A, a printed circuit board, in which an upper via 116 exists in an upper insulating layer 106 and a ball land 210 overlaps the upper via 116 and covers the upper insulating layer 106 is prepared. The upper insulating layer 106 corresponds to a body portion constituting the printed circuit board, and may be formed as a thin layer by pressing, for example, phenol or epoxy glass (or FR-4) resin to have a desired thickness. Further, the ball land 210 may be implemented by coating a copper foil on the body portion of the printed circuit board and forming a wiring pattern, which is a transfer passage of an electric signal, through pattering.

Figure 10B:
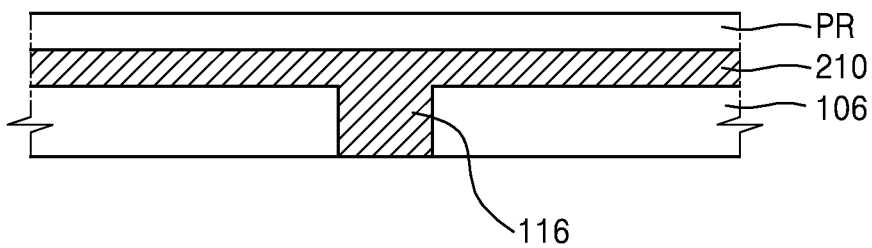
Figure 10C:
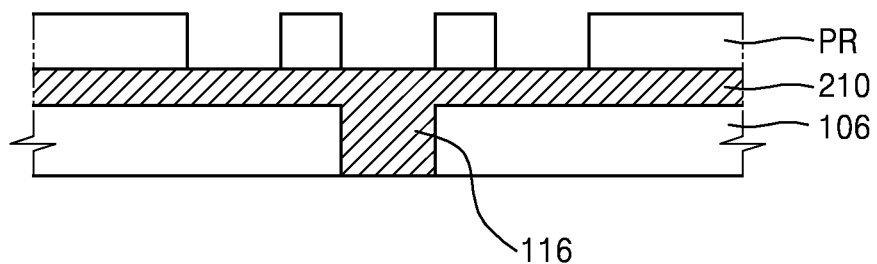

Referring to FIGS. 10B and 10C, a photoresist is coated on the ball land 210 and a photo mask pattern PR, which exposes a portion in which the first plating layer 220 (see FIG. 10E) is to be formed, is formed. The photo mask pattern PR may be formed such that a ratio of areas occupied by the first plating layer 220 (see FIG. 10H) and the second plating layer 230 (see FIG. 10H) in an upper surface of the ball land 210 is approximately 1:1, as described with reference to FIG. 9.

Figure 10D:
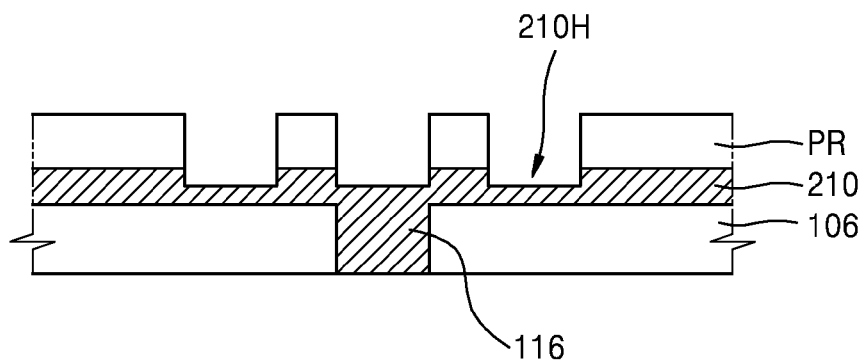

Referring to FIG. 10D, a groove 210H is formed in the ball land 210 by etching a portion of the ball land 210 using the photo mask pattern PR. A depth of the groove 210H may be less than a thickness of the ball land 210.

Figure 10E:
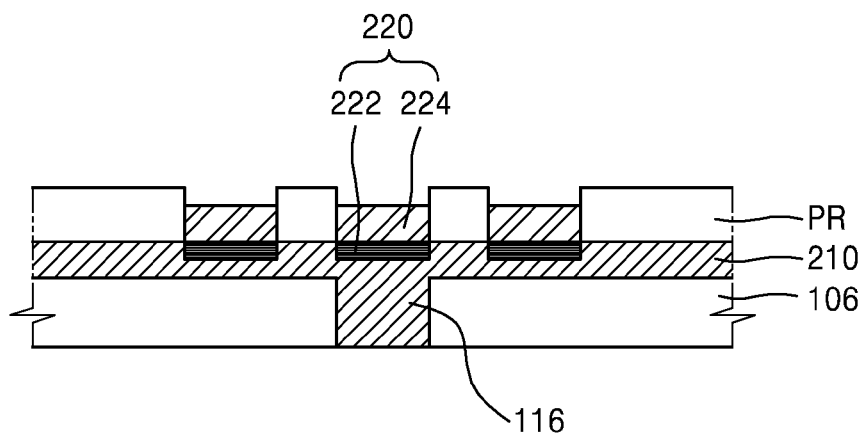
Figure 10F:
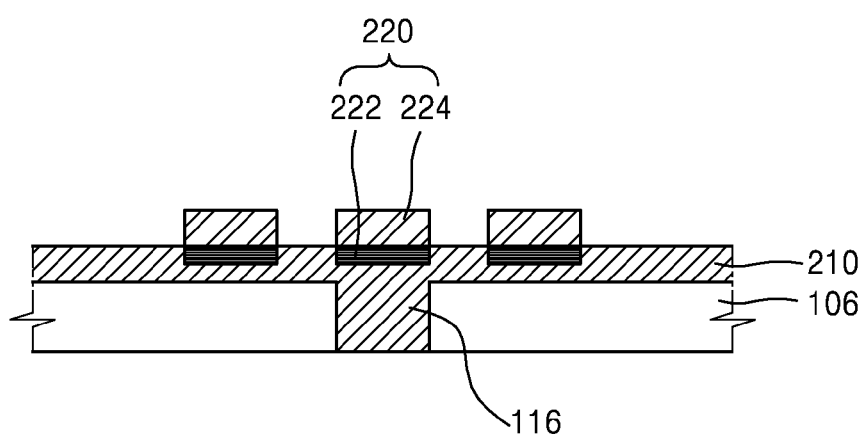

Referring to FIGS. 10E and 10F, the first plating layer 220 is formed in the groove 210H of the ball land 210 while being confined by the photo mask pattern PR. The lower layer 222 of the first plating layer 220 may be formed in the groove 210H and the upper layer 224 of the first plating layer 220 may be formed by using sidewalls of the photo mask pattern. The first plating layer 220 may be formed by using, for example, an electroplating method or an electroless plating method. The first plating layer 220 may include at least one selected from the group consisting of Ni/Au, Ni/Pd/Au, Ni/Ag, Ni/Pd/Ag, Ni/Sn, Ni/Cu, and Ni/Pd. Although the first plating layer 220 is illustrated as including two layers, the inventive concepts are not limited thereto. After the first plating layer 220 is formed, the photo mask pattern PR is removed. The photo mask pattern PR may be removed by using an ashing and strip process.

Figure 10G:
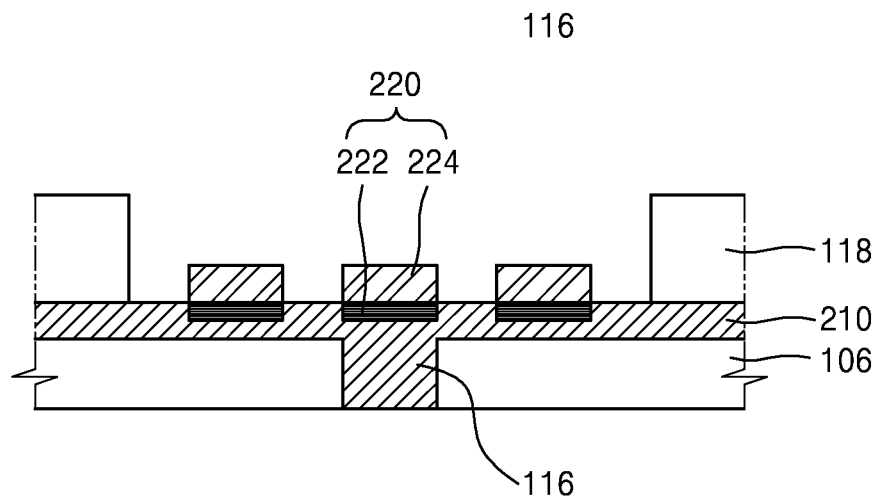

Referring to FIG. 10G, after the first plating layer 220 is formed on the ball land 210, a solder resist 118 is formed to cover edge portions of the ball land 210. The solder resist 118 exposes a portion of the ball land 210 and the first plating layer 220 such that the internal connection terminals 130 (see FIG. 1) are connected thereto. The solder resist 118 may be formed of, for example, a photo solder resist on which a photo process may be conducted.

Figure 10H:
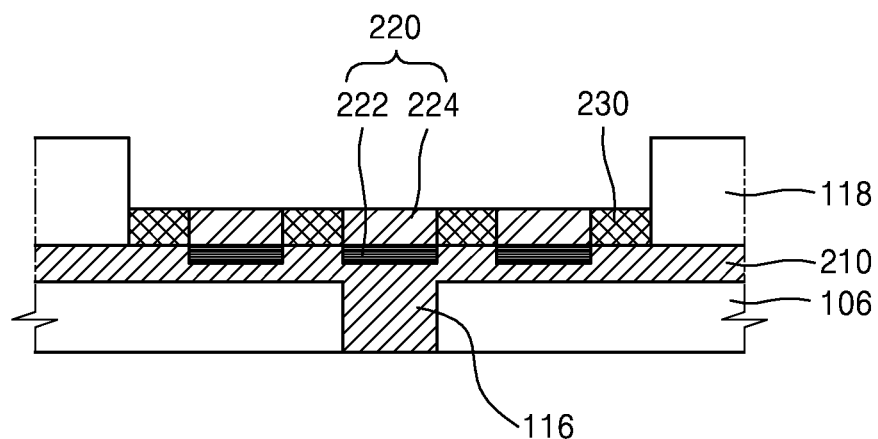

Referring to FIG. 10H, the second plating layer 230 may be formed on the exposed portion of the upper surface of the ball land 210. The level of the upper surface of the second plating layer 230 may be the same as or similar to that of the upper surface of the first plating layer 220. The second plating layer 230 may be formed in regions which are divided by the first plating layer 220 and in regions confined by the solder resist 118. The second plating layer 230 may include at least one selected from the group consisting of OSP, Ag, Au, Pd, and Sn. Although the second plating layer 230 is illustrated as including a single layer, the inventive concepts are not limited thereto.

Through the above-described processes, a printed circuit board for a semiconductor package may be provided, which has a hybrid type surface in which both the first plating layer 220 and the second plating layer 230 are formed on the upper surface of the ball land 210.

Figure 11:
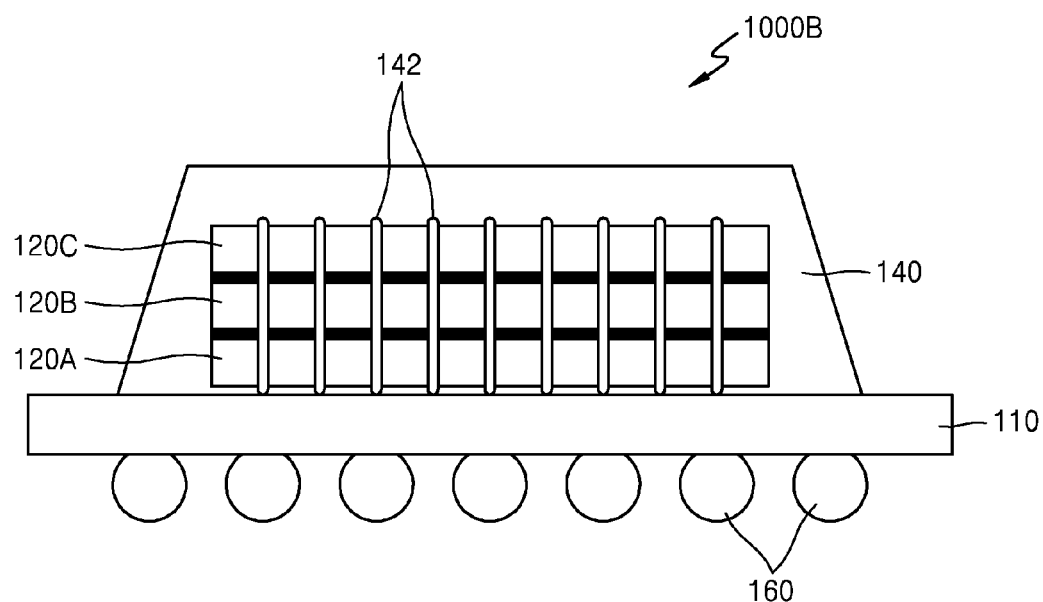
FIG. 11 is a cross-sectional view of a semiconductor package including a printed circuit board for a semiconductor package, according to another example embodiment of the inventive concepts.

FIG. 11 s a cross-sectional view of a semiconductor package 1000B including a printed circuit board 110 for a semiconductor package, according to another example embodiment of the inventive concepts.

Referring to FIG. 11, the semiconductor package 1000A, in which one semiconductor chip 120 (see FIG. 1) is mounted on the printed circuit board 110 for a semiconductor package according to the example embodiment of the inventive concepts through the internal connection terminals 130 (see FIG. 1), has been described.

Referring to FIG. 11, the printed circuit board 110 for a semiconductor package according to an example embodiment of the inventive concepts is applicable to a multi-chip semiconductor package 1000B in which a plurality of semiconductor chips 120A, 120B, and 120C are mounted on the printed circuit board 110 in a vertical direction and are electrically connected through a through-silicon via 142. In this case, an internal connection terminal may be formed at a lowermost portion of the through-silicon via 142. According to a modified example embodiment, the plurality of semiconductor chips 120A, 120B, and 120C may be mounted in a horizontal direction. The semiconductor package 1000B may further include a molding member 140 that seals the semiconductor chips 120A, 120B, and 120C mounted on the printed circuit board 110 and external connection terminals 160 that are disposed under the printed circuit board 110 to expand functions of the semiconductor chips 120A, 120B, and 120C to the outside.

Figure 12:
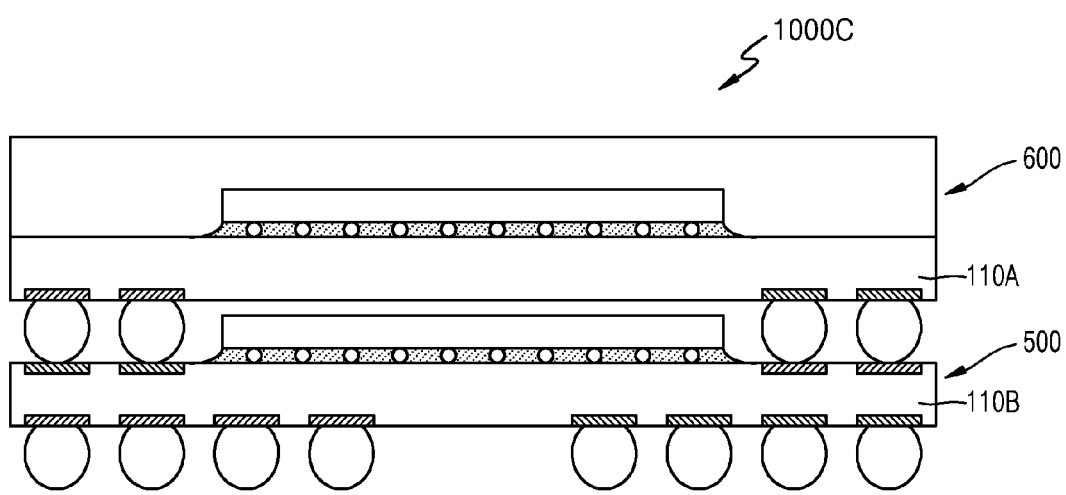
FIG. 12 is a cross-sectional view of a semiconductor package including a printed circuit board for a semiconductor package, according to another example embodiment of the inventive concepts.

FIG. 12 s a cross-sectional view of a semiconductor package 1000C including printed circuit boards 110A and 100B for a semiconductor package, according to another example embodiment of the inventive concepts.

The multi-chip semiconductor package 1000B (see FIG. 11) using the through-silicon via 142 (see FIG. 11) has been described with reference to FIG. 11 as a semiconductor package to which a printed circuit board for a semiconductor package according to the inventive concepts is applied.

Referring to FIG. 12, a semiconductor package to which a printed circuit board for a semiconductor package according to the inventive concepts may be applied to a package on package (POP) type of system in package (SIP) 1000C as illustrated in FIG. 12. In the drawing, the above-described printed circuit board for a semiconductor package is applicable to the printed circuit board 100A of an upper semiconductor package 600 and a printed circuit board 100B of a lower semiconductor package 500.

Figure 13:
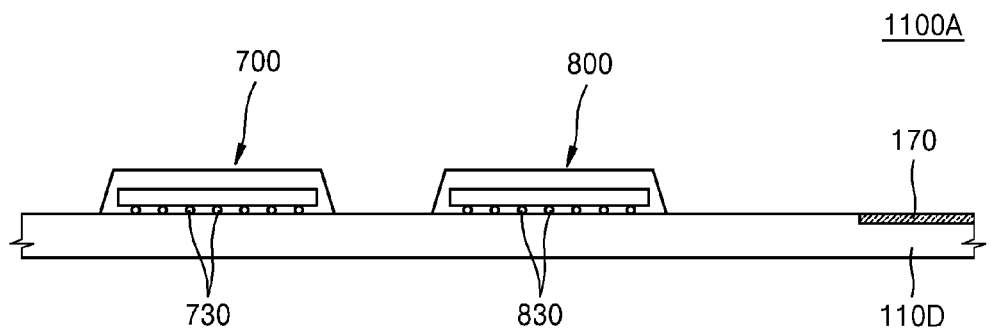
FIG. 13 is a cross-sectional view of a semiconductor module including a printed circuit board, according to an example embodiment of the inventive concepts.

FIG. 13 is a cross-sectional view of a semiconductor module 1100A including a printed circuit board according to an example embodiment of the inventive concepts.

The semiconductor packages 1000A, 1000B, and 1000C have been described with reference to FIGS. 1, 11, and 12, as some example embodiments to which the printed circuit board 110 for a semiconductor package according to an example embodiment of the inventive concepts is applied.

The printed circuit board 110 for a semiconductor package according to an example embodiment of the inventive concepts is applicable to not only a semiconductor package but also the semiconductor module 1100A. On a printed circuit board 110D of the semiconductor module 1100A, chip scale packages 700 and 800 are mounted through internal connection terminals 730 and 830. In this case, the internal connection terminals 730 and 830, in regions in which the chip scale packages 700 and 800 of the printed circuit board 110D are mounted, are connected on the ball land having the first plating layer and the second plating layer. The semiconductor module 1100A may further include a connector 170 used when the semiconductor module 1100A is connected to another printed circuit board. The semiconductor module 1100A may be, for example, a solid state drive (SSD) or a dynamic random access memory (DRAM) module.

Figure 14:
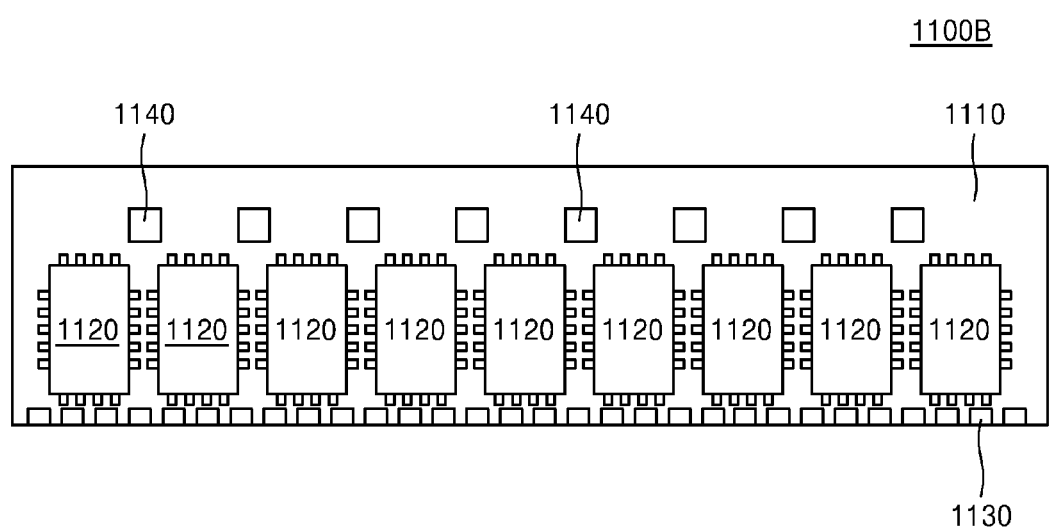
FIG. 14 is a plan view of a semiconductor module including a printed circuit board, according to an example embodiment of the inventive concepts.

FIG. 14 is a plan view of a semiconductor module 1100B including a printed circuit board according to an example embodiment of the inventive concepts.

Referring to FIG. 14, the semiconductor module 1100B may include a printed circuit board 1110, and a plurality of semiconductor packages 1120 attached to the printed circuit board 1110. A connection portion 1130 that is capable of being engaged with a socket of a main board is disposed in one edge of the printed circuit board 1110. A ceramic decoupling capacitor 1140 is disposed on the printed circuit board 1110. The semiconductor module 1100B according to the inventive concepts is not limited to the configuration illustrated in FIG. 14, and may be manufactured in various types. The printed circuit board 1110 may be the printed circuit board 110 (see FIG. 1) for a semiconductor package according to an example embodiment of the inventive concepts.

Figure 15:
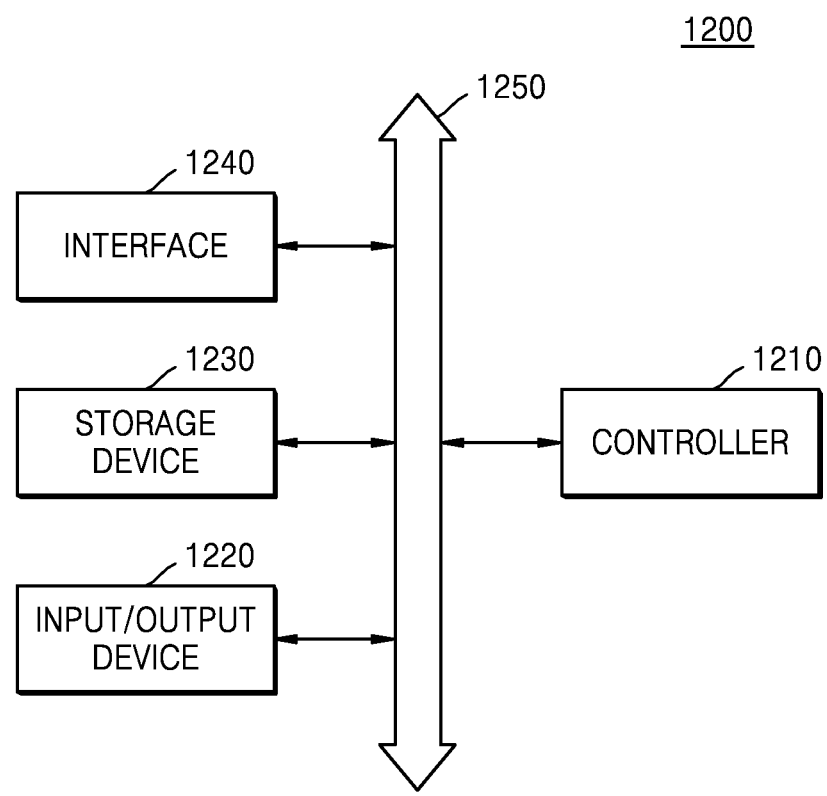
FIG. 15 is a configuration diagram of a system including a semiconductor package, according to an example embodiment of the inventive concepts.

FIG. 15 is a configuration diagram of a system 1200 including a semiconductor package according to an example embodiment of the inventive concepts.

Referring to FIG. 15, the system 1200 may include a controller 1210, an input/output device 1220, a storage device 1230, and an interface 1240. For example, the system 1200 may be a mobile system or a system that transmits or receives information. In some example embodiments, the mobile system may be a personal digital assistant (PDA), a portable computer, a web tablet, a wireless phone, a mobile phone, a digital music player, or a memory card. The controller 1210 may be configured to control execution programs in the system 1200 and may be implemented by using, for example, a microprocessor, a digital signal processor (DSP), a microcontroller, etc. The input/output device 1220 may be used to input and output data of the system 1200. The system 1200 may be connected to an external device, for example, a personal computer or a network, by using the input/output device 1220 and may exchange data with the external device. The input/output device 1220 may be, for example, a keypad, a keyboard, or a display. The storage device 1230 may store codes and/or data for operations of the controller 1210 or may store data processed by the controller 1210. The controller 1210 or the storage device 1230 may include a semiconductor package according to an example embodiment of the inventive concepts. For example, the controller 1210 or the storage device 1230 may include the semiconductor package 1000A, 1000B, and 1000C illustrated in FIGS. 1, 11, and 12. The interface 1240 may be a data transmission passage between the system 1200 and another external device. The controller 1210, the input/output device 1220, the storage device 1230, and the interface 1240 may communicate with one another through a bus 1250. The system 1200 may be used in, for example, a mobile phone, an MP3 player, a navigation device, a portable multimedia player (PMP), an SSD, or household appliances.

Figure 16:
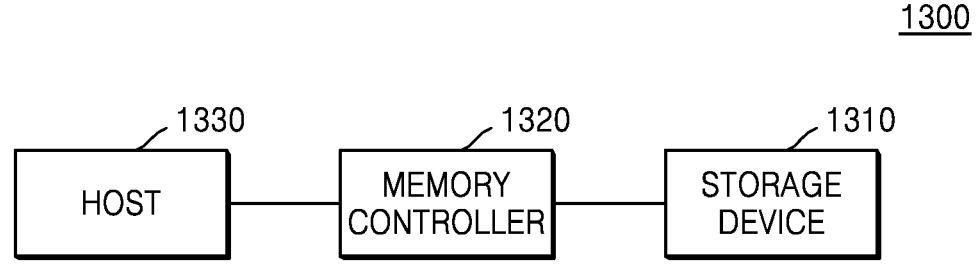
FIG. 16 is a configuration diagram of a memory card including a semiconductor package, according to an example embodiment of the inventive concepts.

FIG. 16 is a configuration diagram of a memory card 1300 including a semiconductor package according to an example embodiment of the inventive concepts.

Referring to FIG. 16, the memory card 1300 may include a storage device 1310 and a memory controller 1320. The storage device 1310 may store data. In some example embodiments, the storage device 1310 may have non-volatile characteristics of allowing stored data to be maintained even when power supply is stopped. The storage device 1310 may include a semiconductor package according to an example embodiment of the inventive concepts. For example, the storage device 1310 may include any one of the semiconductor packages 1000A, 1000B, and 1000C illustrated in FIGS. 1, 11, and 12. The memory controller 1320 may read data stored in the storage device 1310 or may store data in the storage device 1310 in response to a read/write request from a host 1330.

While the inventive concepts have been particularly shown and described with reference to some example embodiments, it will be understood that various changes in form and details may be made therein without departing from the spirit and scope of the following claims.

What is claimed is:

1. A printed circuit board for a semiconductor package comprising:
a printed circuit board body;
a plurality of ball lands on one surface of the printed circuit board body;
a first plating layer on a portion of each of the ball lands; and
a second plating layer on another portion of each of the ball lands, an upper surface of the first plating layer being substantially coplanar with an upper surface of the second plating layer,
wherein the first plating layer and the second plating layer cover entire exposed upper surfaces of the ball lands.

2. The printed circuit board of claim 1, wherein the first plating layer or the second plating layer has a single-layered structure or a multi-layered structure.

3. The printed circuit board of claim 1, wherein at least one of the first plating layer and the second plating layer is made of a plurality of materials.

4. The printed circuit board of claim 1, wherein the first plating layer includes at least one selected from the group consisting of Ni/Au, Ni/Pd/Au, Ni/Ag, Ni/Pd/Ag, Ni/Sn, Ni/Cu, and Ni/Pd.

5. The printed circuit board of claim 1, wherein the second plating layer includes at least one selected from the group consisting of organic solderability preservative (OSP), Ag, Au, Pd, and Sn.

6. The printed circuit board of claim 1, wherein when the printed circuit board is viewed from above, the first plating layer and the second plating layer are alternately arranged in a checkerboard pattern.

7. The printed circuit board of claim 1, wherein when the printed circuit board is viewed from above, the first plating layer and the second plating layer have a circular shape.

8. The printed circuit board of claim 1, wherein a surface where the first plating layer and the second plating layer form a concave-convex shape when viewed laterally.

9. The printed circuit board of claim 1, wherein the ball lands, the first plating layer, and the second plating layer are electrically connected to one another.

10. A printed circuit board for a semiconductor package, the printed circuit board comprising:
a printed circuit board body including internal metal wirings;
a plurality of ball lands on one surface of the printed circuit board body, the ball lands electrically connected to the internal metal wirings;
a first plating layer on a portion of each of the ball lands; and
a second plating layer on another portion of each of the ball lands, the first plating layer and the second plating layer forming a concave-convex shape when viewed laterally,
wherein the first plating layer is a stack of different conductive metal layers.

11. The printed circuit board of claim 10, wherein an upper surface of the first plating layer is higher than an upper surface of the second plating layer with respect to the printed circuit board body.

12. The printed circuit board of claim 10, wherein
the ball land has a concave-convex shape having a convex portion and a concave portion, and
the first plating layer covers the concave portion of the ball land and the second plating layer fills the convex portion of the ball land.

13. The printed circuit board of claim 10, wherein the first plating layer is configured to improve thermal cycle reliability and the second plating layer is configured to improve drop reliability.

14. A printed circuit board for a semiconductor package comprising:
- a printed circuit board body;
- a ball land on one surface of the printed circuit board body;
- a plurality of first plating layers and a plurality of second plating layers on the ball land, the first plating layers and the second plating layers interleaving each other,
- wherein each of the plurality of first and second plating layers is a stack of different conductive metal layers.

15. The printed circuit board of claim 14, wherein the ball land includes a plurality of grooves defined therein and each of the grooves are at least partially filled with at least a portion of a corresponding one of the first plating layers.

16. The printed circuit board of claim 15, wherein upper surfaces of the first plating layers are substantially coplanar with upper surfaces of the second plating layers.

17. The printed circuit board of claim 15, wherein the stack of different conductive metal layers includes an upper layer and a lower layer, the lower layer fills a corresponding one of the grooves to provide a convex portion protruding from a top surface of the ball land, and the upper layer covers top and side surfaces of the convex portion.

18. The printed circuit board of claim 15, wherein the second plating layers cover top and side surfaces of a plurality of convex portions of the ball land that are defined by the grooves.

* * * * *